US007232317B2

(12) United States Patent
Ookura

(10) Patent No.: US 7,232,317 B2

(45) Date of Patent: Jun. 19, 2007

(54) CONNECTOR FOR ELECTRICALLY CONNECTING ELECTRONIC COMPONENTS

(75) Inventor: Kenji Ookura, Hisai (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 10/561,527

(22) PCT Filed: Mar. 28, 2005

(86) PCT No.: PCT/JP2005/005754

§ 371 (c)(1), (2), (4) Date: Dec. 20, 2005

(87) PCT Pub. No.: WO2005/096456

PCT Pub. Date: Oct. 13, 2005

(65) Prior Publication Data

US 2006/0258227 A1 Nov. 16, 2006

(30) Foreign Application Priority Data

Mar. 31, 2004 (JP) ............................ 2004-107304

(51) Int. Cl.
*H01R 12/00* (2006.01)
*H05K 1/00* (2006.01)

(52) U.S. Cl. ......................... 439/74; 439/660; 439/940

(58) Field of Classification Search ................. 439/74, 439/660, 940, 135
See application file for complete search history.

(56) References Cited

U.S. PATENT DOCUMENTS 6,623,308 B2 9/2003 Ono ........................... 439/680

(Continued)

FOREIGN PATENT DOCUMENTS

JP 3014608 6/1995

(Continued)

OTHER PUBLICATIONS

English Language Abstract of JP 2003-017162.

(Continued)

*Primary Examiner*—Javaid H. Nasri
(74) *Attorney, Agent, or Firm*—Greenblum & Bernstein, P.L.C.

(57) ABSTRACT

A protruding table which was conventionally provided in a center portion of a socket body is eliminated, so that a dimension of a socket in widthwise direction is reduced. When the socket is mounted on a circuit board, an adsorption cover is attached to the socket, and the socket is adsorbed by and held on an adsorption nozzle via the adsorption cover. On the other hand, with respect to a header, gaps between header posts arranged in longitudinal direction are separated by cross walls, so that concave portions are formed between the cross walls. Under a state that an adsorption face of the adsorption nozzle is contacted with the header so that a suction opening of the adsorption nozzle face the concave portion, an enclosed space is formed by at least two cross walls, a bottom face of the concave portion and the adsorption face of the adsorption nozzle. When air in the enclosed space is sucked from the suction opening of the adsorption nozzle, negative pressure occurs, so that the header is adsorbed by and held on the adsorption nozzle. Consequently, it enables the adsorption and holding by the adsorption nozzle, and enables to reduce a dimension of the socket in widthwise direction.

10 Claims, 12 Drawing Sheets

U.S. PATENT DOCUMENTS 6,806,801 B2 10/2004 Kadoya et al. ............... 335/78
6,821,158 B2 11/2004 Iida et al. ................... 439/660
6,827,588 B1 * 12/2004 Huang et al. ................. 439/74

FOREIGN PATENT DOCUMENTS

JP 2002-008753 1/2002
JP 2003-017162 1/2003
JP 2004-055306 2/2004
JP 2004-055464 2/2004
JP 2004-111081 4/2004

OTHER PUBLICATIONS

English Language Abstract of JP 3014608.
English Language Abstract of JP 2004-055306.
English Language Abstract of JP 2002-008753.
English Language Abstract of JP 2004-111081.
English Language Abstract of JP 2004-055464.
U.S. Appl. No. 10/561,526, filed on Dec. 20, 2005.
U.S. Appl. No. 10/548,433, filed on Sep. 8, 2005.
U.S. Appl. No. 10/558,486, filed on Nov. 28, 2005.

* cited by examiner

FIG. 7A
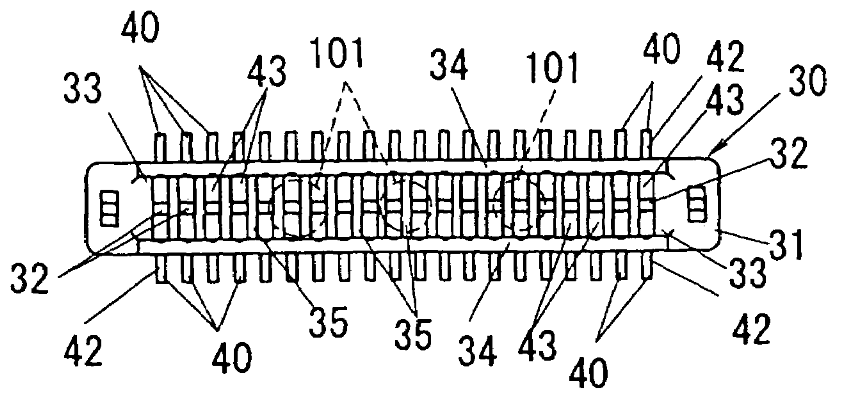
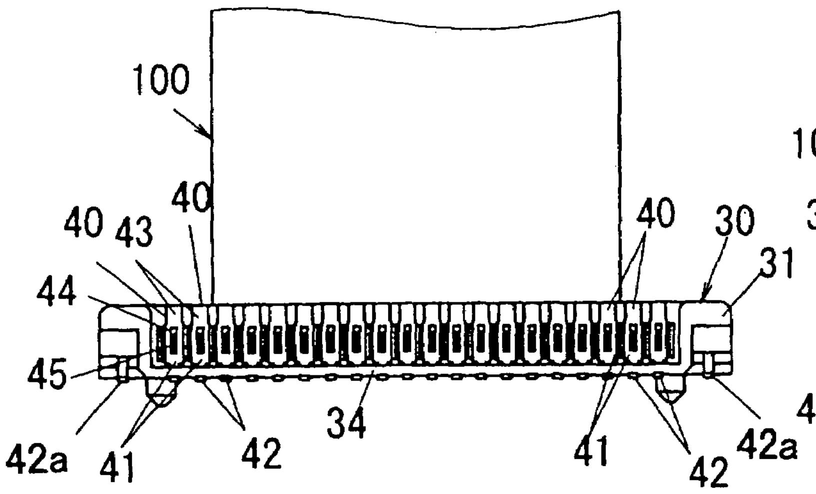
FIG. 7B
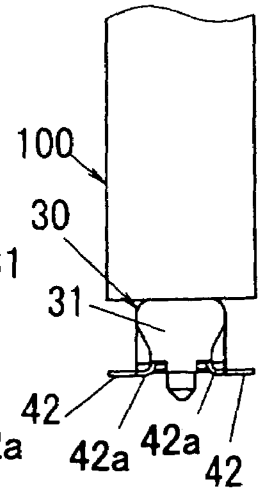
FIG. 7C

FIG. 11A
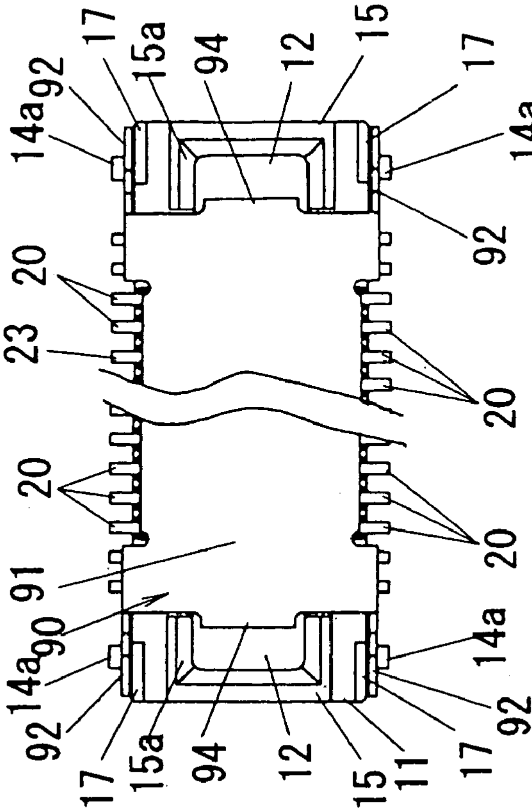
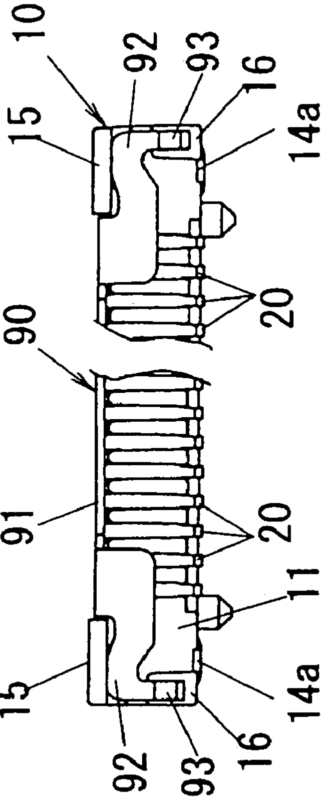
FIG. 11B
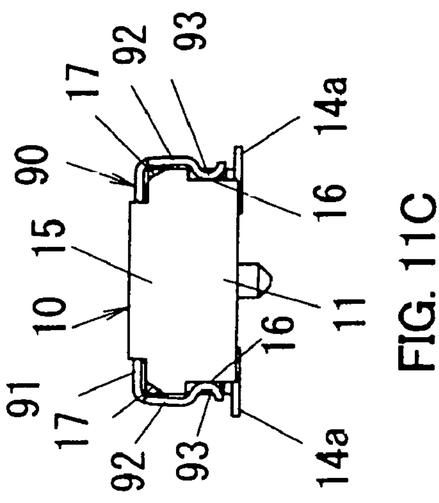
FIG. 11C

FIG. 14A
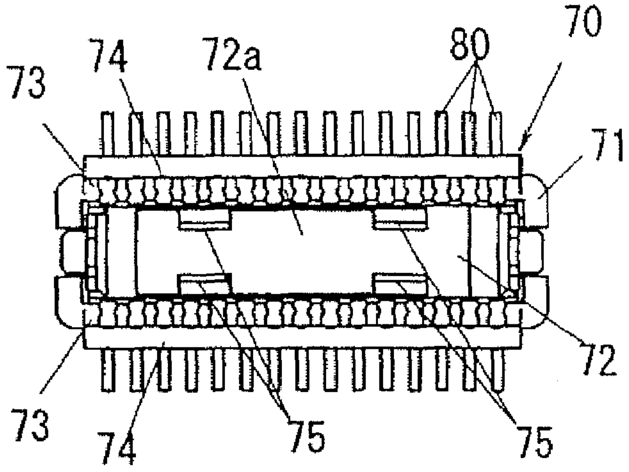
FIG. 14B
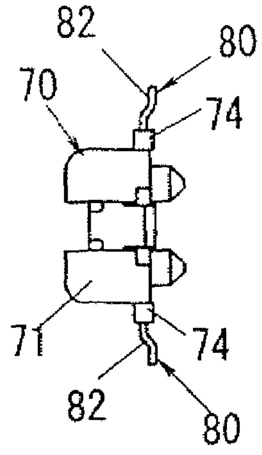
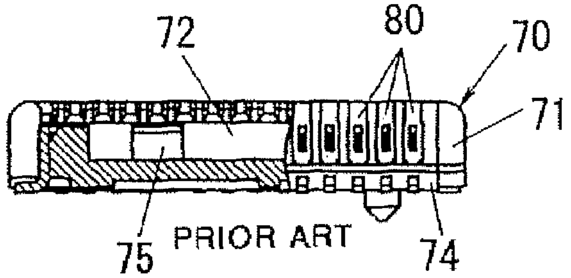
PRIOR ART
FIG. 14C
PRIOR ART
FIG. 15
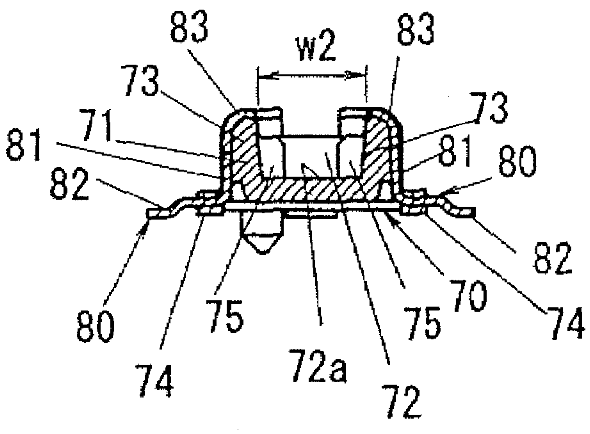

CONNECTOR FOR ELECTRICALLY CONNECTING ELECTRONIC COMPONENTS

This application is based on Japanese patent application 2004-107304 filed in Japan, the contents of which are hereby incorporated by reference.

TECHNICAL FIELD

The present invention relates to a connector comprising a socket and a header for electrically connecting between circuit boards or a circuit board and an electronic component in compact electronic equipment such as a mobile phone.

BACKGROUND ART

Conventionally, a connector which is comprised of a socket and a header is provided for electrically connecting between circuit boards, for example, an FPC and a hard board. A conventional connector mentioned in, for example, Japanese Laid-Open Patent Publication No. 2002-8753 is described with reference to FIGS. 12A to 12C, FIG. 13, FIGS. 14A to 14C and FIG. 15.

As shown in FIGS. 12A to 12C and FIG. 13, a socket 50 has a socket body 51 which is formed into a substantially flat rectangular parallelepiped shape by resin molding and a plurality of socket contacts 60 which is arranged on two lines along longitudinal direction of the socket body 51. Seen from front, a protruding table 53 of substantially rectangular parallelepiped shape is formed in a center portion of the socket body 51, and a plug groove 52 of substantially rectangular shape is formed between the protruding table 53 and each side wall 54 in longitudinal direction and each side wall 56 in widthwise direction.

The socked contact 60 is formed by bending a band metal into a predetermined shape by press working. A first contact portion 61 which is to be contacted with a header post 80 (referring to FIGS. 14A to 14C and FIG. 15) is formed at a first end portion of each socket contact 60 facing the plug groove 52. A first terminal portion 62 which is to be soldered on a conductive pattern of a circuit board is formed at a second end portion of the socket contact 60 positioned outward of the side wall 54. Each socket contact 60 is press-fitted after resin molding of the socket body 51.

On the other hand, as shown in FIGS. 14A to 14C and FIG. 15, a header 70 has a header body 71 which is formed in a shape of substantially flat rectangular parallelepiped by resin molding and a plurality of header post 80 which is arranged on two lines along longitudinal direction of the header body 71. An engaging groove 72 of substantially rectangular parallelepiped shape with which the protruding table 53 is engaged is formed at a position facing the protruding table 53 of the socket body 51. Flange portions 74 are formed on side walls 73 of the header body 71 so as to protrude substantially perpendicular to the side walls 73 from edges on rear face side (circuit board side) of the header body 71. Furthermore, engaging protrusions 75 which are to be engaged with key grooves 55 provided on the protruding table 53 of the socket 50 are formed at four positions on wall faces of the side walls 73 in side of the engaging groove 72 so that impact applied while the socket 50 and the header 70 are connected is dispersed.

The header post 80 is formed by bending a band metal into a predetermined shape by press working. A second contact portion 81 which is to be contacted with the first contact portion 61 of the socket contact 60 is formed at a position of each header post 80 along an outer surface of the side wall 73. Furthermore, a second terminal portion 82 which is to be soldered on a conductive pattern of a circuit board is formed at an end portion protruding outward from the flange portion 74. Each header post 80 is integrally fixed on the header body 71 by insert molding while the header body 71 is molded by resin.

The socket 50 and the header 70 are mounted so that the first terminal portion 62 of each socket contact 60 and the second terminal portion 82 of each header post 80 are respectively soldered on conductive patterns of circuit boards. When the header 70 is engaged with the plug groove 52 of the socket 50, the protruding table 53 of the socket 50 is relatively engaged with the engaging groove 72 of the header 70, and the first contact portion 61 of the socket contact 60 contacts the second contact portion 81 of the header post 80 with elastic deformation. As a result, a circuit board on which the socket is mounted is elastically connected with a circuit board on which the header 70 is mounted.

By the way, in the connector used for a compact electronic equipment such as a mobile phone, the pitch of the socket contacts 60 and the header posts 80 is very narrow as, for example, 0.4 mm extent. In addition, a connector further downsized is demanded for further downsizing the electronic equipment. On the other hand, a dimension of the connector in longitudinal direction (arranging direction of the socket contacts 60 and the header posts 80) depends on the pitch and the number of the socket contact 60 and the header post 80. In addition, there is a limit to make the pitch of the socket contacts 60 and the header posts 80 narrower because of securing the distance for insulation. Accordingly, the downsizing of the connector can be achieved by reducing the dimension in widthwise direction thereof.

Generally, when the plug groove 52, with which the header body 71 is engaged, is formed on the socket body 51, mechanical strength of the socket body 51 becomes weak so that it is easily deformed. In the above-mentioned conventional connector, in order to increase the mechanical strength of the socket body 51, the protruding table 53 is provided in the inside of the plug groove 52, and the engaging groove 72 which is to be engaged with the protruding table 53 is formed on the header body 71. Therefore, the conventional connector has a problem that dimensions in widthwise directions of the socket body 51 and the header body 71 becomes larger by the dimension of the protruding table 53.

Furthermore, a curved surface portion 83 is provided in the vicinity of the front end of the header post 80 so as to contact the socket contact 60 with the header post 80 smoothly, but it is necessary to provide the engaging groove 72 on the header body 71, so that it is difficult to take a configuration that a front end of the curved surface portion 83 is hooked on the header body 71. Therefore, for example, when the header 70 is taking out and putting in for the socket 50 obliquely, the header body 71 may be deformed, and the front end of the curved surface portion 83 of the header post 80 may be raised and come off from the header body 71.

Still furthermore, when the header 70 is mounted on a circuit board, a suction opening of an adsorption nozzle which is not illustrated is contacted to a bottom face 72*a* of the engaging groove 72 of the header body 71 so as to suck air, so that the header 70 is held by adsorption. Then, the adsorption nozzle is moved to transfer the header 70 to a mounting position. Therefore, the bottom face 72*a* of the engaging groove 72 must be formed larger than a front end portion of the suction opening of the adsorption nozzle so as to form no gap between the suction opening of the adsorption nozzle and the bottom face 72*a* of the engaging groove 72 when the suction opening of the adsorption nozzle is contacted to a adsorption face, that is, the bottom face 72*a* of the engaging groove 72 of the header body 71. Thus, since a width W2 of the bottom face 72*a* of the engaging groove 72 cannot be made smaller than a diameter of the suction opening of the adsorption nozzle in widthwise direction of the header body 71, there is a limit to downsize the dimension of the header 70 in the widthwise direction thereof.

Similarly, when the socket 50 is mounted on a circuit board, a suction opening of an adsorption nozzle is contacted to a front end face 53*a* of the protruding table 53 of the socket body 51 so as to suck air, so that the socket 50 is held by adsorption. Then, the adsorption nozzle is moved to transfer the socket 50 to a mounting position. Therefore, the front end face 53*a* of the protruding table 53 of the socket body 51 must be formed larger than a front end portion of the suction opening of the adsorption nozzle, so that a width W1 of the front end face 53*a* of the protruding table 53 cannot be made smaller than a diameter of the suction opening of the adsorption nozzle in widthwise direction of the header body 71, and there is a limit to downsize the dimension of the socket 50 in the widthwise direction thereof.

DISCLOSURE OF INVENTION

A purpose of the present invention is to provide a connector which can be downsized with assuring adsorption faces by the adsorption nozzles.

A connector in accordance with an aspect of the present invention includes:

a header comprising a header body formed of an insulation material, and one or a plurality of header posts held on a side wall of the header body; and a socket comprising a socket body formed on an insulation material and having a plug groove with which the header is engaged, and one or a plurality of socket contacts held on a side wall of the plug groove of the socket body and contacted with the header posts when the header is engaged with the plug groove; characterized by that the header body has a concave portion on a first face in side which is to be engaged with the plug groove of the socket body;

the header post has a second contact portion disposed along a side wall of the header body and contacted with a first contact portion of the socket contact, a curved portion formed in a substantially reverse U-shape from a vicinity of an end in the first face side of the side wall of the header body toward the concave portion, and a terminal portion formed to protrude outward from a side of the second contact portion opposite to the curved portion to be substantially perpendicular to the side wall and to be soldered on a circuit board; and the concave portion is separated by at least two cross walls so that an enclosed space is formed by at least two cross walls, a bottom face of the concave portion and the adsorption face of the adsorption nozzle in a state that the adsorption face of the adsorption nozzle is contacted with the first face so that a suction opening of the adsorption nozzle faces the concave portion.

Furthermore, it is possible to be constituted that the socket body has an engaging groove of substantially rectangular shape with which the header is engaged formed in center portion thereof seen from front, and four engaging concavities formed in vicinities of both end portions of both side walls, and when the socket is mounted on a circuit board, an adsorption cover is attached to the socket due to engaging portions of the adsorption cover covering at least a part of the engaging groove are engaged with the engaging concavities of the socket body, and a portion of the adsorption cover covering a part of the engaging groove is adsorbed and held by the adsorption nozzle.

According to such a configuration, the dimension of the connector in widthwise direction can be made smaller than that of the conventional one by eliminating the protruding table of the socket body. Furthermore, for at least the header, an enclosed space is formed by at least two cross walls, the bottom face of the concave portion and the adsorption face of the adsorption nozzle, when the suction opening of the adsorption nozzle is contacted with and faces the concave portion. Thus, by sucking air in the enclosed space from the suction opening, negative pressure occurs so that the header is adsorbed by and held on the adsorption nozzle.

Since the dimensions of the concave portion in longitudinal direction and in widthwise direction can be made smaller than a diameter of the suction opening of the adsorption nozzle, respectively, the dimension of the header body in widthwise direction can be made smaller in comparison with the conventional example that the adsorption nozzle is contacted with the bottom face of the engaging groove provided on the header body. As a result, the header can be downsized with assuring the adsorption face of the adsorption nozzle.

Furthermore, since the front end of the curved portion of the header post reaches to the concave portion of the header body, the front end of the header post is engaged with the header body. Thus, even when the header body is deformed, the front end of the header post is not lifted from the header body, so that the flaking of the header post from the header body can be prevented.

Still furthermore, even when the protruding table of the socket body is eliminated, it can be adsorbed by and held on the adsorption nozzle by attaching the adsorption cover. Thus, the dimension of the socket body in widthwise direction can be made smaller, so that it is possible to downsize the socket.

BRIEF DESCRIPTION OF DRAWINGS

FIG. 7A is a front view showing relations between position and size of a suction opening of an adsorption nozzle and the header of the connector in accordance with the above embodiment, FIG. 7B is a bottom view showing a state that the header is adsorbed by and held on the adsorption nozzle, and FIG. 7C is a right side view thereof.

FIG. 11A is a front view showing a state that the adsorption cover is attached to the socket of the connector in accordance with the above embodiment, FIG. 11B is a bottom view thereof, and FIG. 11C is a left side view thereof.

FIG. 14A is a front view showing the header of the conventional connector, FIG. 14B is a right side view thereof and FIG. 14C is a bottom view thereof.

FIG. 15 is a side sectional view of the header of the above conventional connector.

BEST MODE FOR CARRYING OUT THE INVENTION

Figure 1:
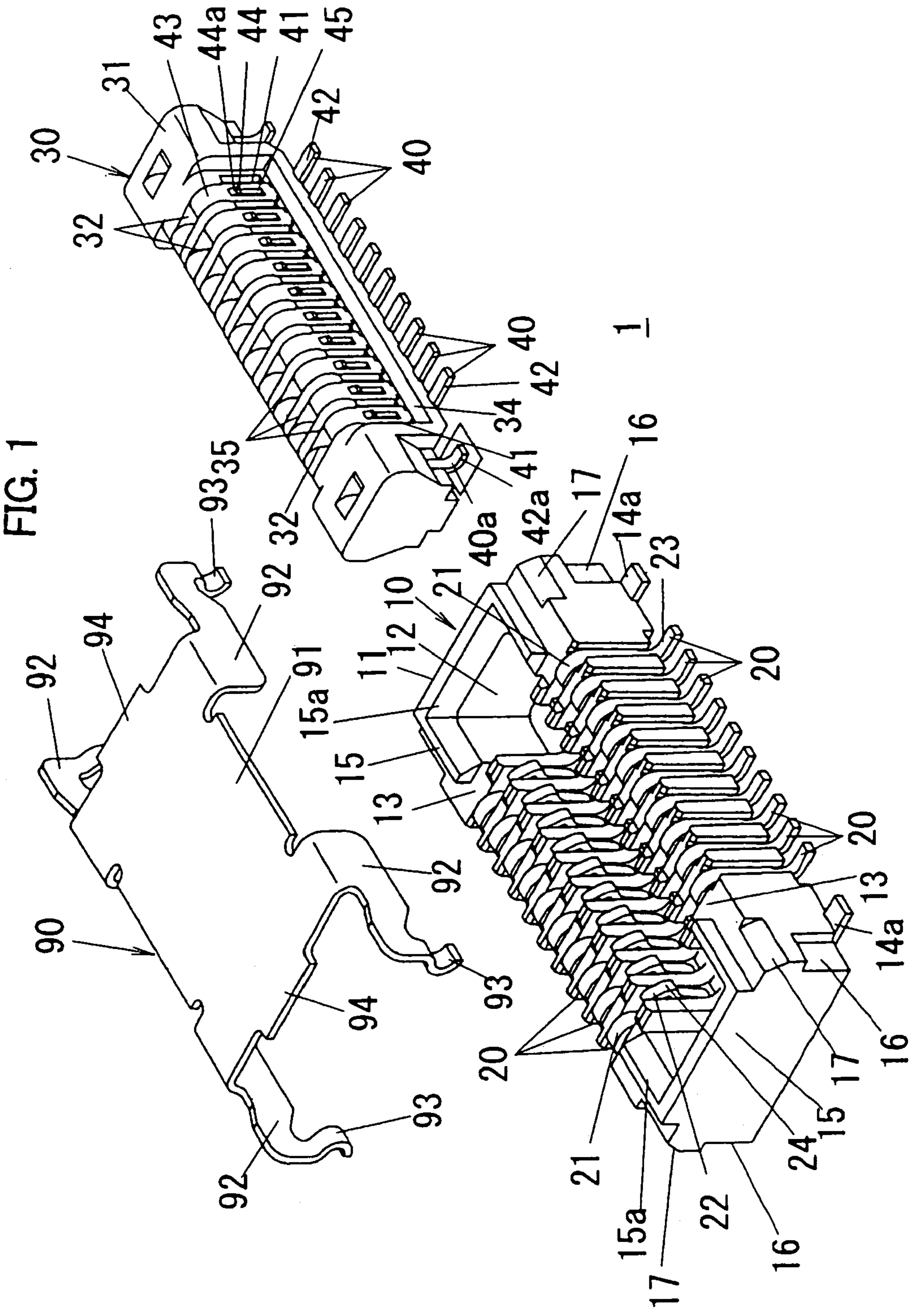
FIG. 1 is a perspective view showing a connector in accordance with an embodiment of the present invention in a state that a socket and a header thereof are divided.

A connector in accordance with an embodiment of the present invention is described in detail with reference to the drawing. A connector 1 of this embodiment is used, for example, electrically to connect between circuit boards or electronic components and the circuit board in compact electronic equipment such as a mobile phone, and it comprises a socket 10 and a header 30 as shown in FIG. 1. Especially, in a flip phone, the circuit board is divided into a plurality of pieces, and a flexible printed-circuit board (FPC) is used for hinge portion. As an example, such connector 1 is used for electrically connecting an FPC with flexibility and a hard circuit board. For example, the socket 10 is mounted on a conductive pattern formed on the hard circuit board by soldering, and the header 30 is mounted on a conductive pattern on the FPC by soldering. Then, by connecting the header 30 with the socket 10 as shown in FIG. 2, the hard circuit board and the FPC can be electrically connected.

As shown in FIG. 1 and FIGS. 3A to 3C, the socket 10 has a socket body 11 formed in a flat rectangular parallelepiped shape by resin molding, and a plurality of socket contacts arranged in two lines along side walls 13 of the socket body 11 in longitudinal direction. Seen from front, a substantially rectangular plug groove 12 is formed in center portion of the socket body 11. Guide walls 15 of substantially square cornered U-shape are provided for protruding toward the header 30 side on a plane of the socket body 11 facing the header 30 and in the vicinity of both end portions of the plug groove 12 in longitudinal direction. Slanted faces 15*a* are formed on inner peripheries (that is, the plug groove 12 side) of the guide walls 15.

Figure 2:
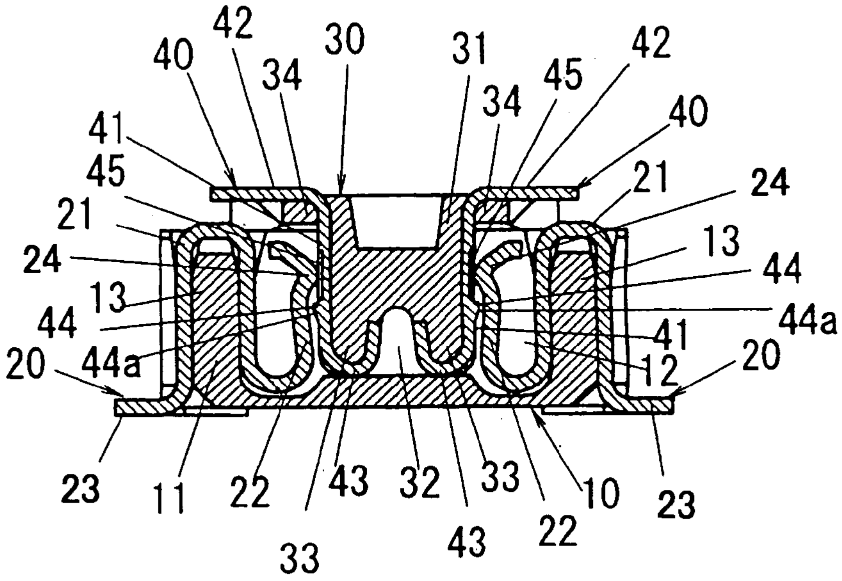
FIG. 2 is a sectional side view showing the connector in accordance with the above embodiment in a state that the socket and the header are connected.
Figure 4:
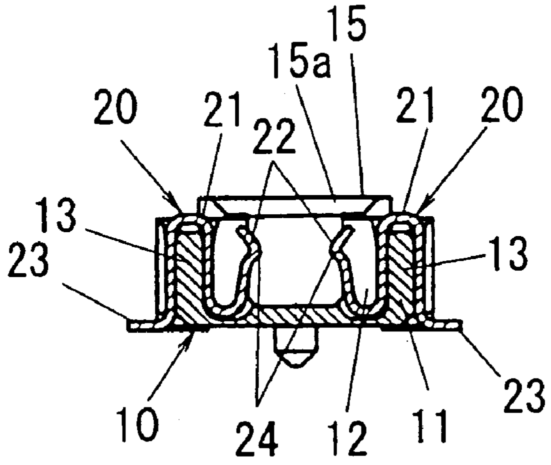
FIG. 4 is aside sectional view of the above socket.

As shown in FIG. 2 and FIG. 4, each socket contact 20 is formed by bending a band metal into a predetermined shape by press working. Each socket contact 20 is press-fitted after resin molding of the socket body 11. As mentioned above, since the pitch between each socket contact 20 is very narrow as 0.4 mm extent, it is nonsense to form the socket contacts 20 and to press-fit those into grooves formed on the side walls of the socket body 11 one by one. Therefore, slit processing is given to a side of a plate base metal so as to form a comb-shaped portion, and press working is further given to the comb-shaped portion to be a predetermined shape. Then, the socket contacts 20 which are arranged in a line on a base of the base metal are simultaneously press-fitted into the grooves formed on the side walls 13 of the socket body 11. Finally, each socket contact 20 is cut off from the base metal.

The socket contact 20 has a held portion 21 formed as substantially reverse U-shape and held on the socket body 11 in a manner to pinch an edge portion of the side wall 13 of the socket body 11, a flexure portion (first contact portion) 22 continuously formed from a portion of the held portion 21 positioned inside of the plug groove 12 and having a substantially U-shape opposite to the substantially reverse U-shape of the held portion 21, and a terminal portion 23 soldered on a conductive pattern of the circuit board and formed to protrude outward in a direction substantially perpendicular to the side walls 13 from a lower end portion (end portion on a side mounted on a circuit board) of outer face of the side wall 13 of the held portion 21. The flexure portion 22 is flexible in the direction substantially perpendicular to the side wall 13 inside of the plug groove 12. Furthermore, a contact salient 24 (free end of the first contact portion) protruding in a direction departing from the held portion 21 is formed on the flexure portion 22 by bending.

Figure 3A:
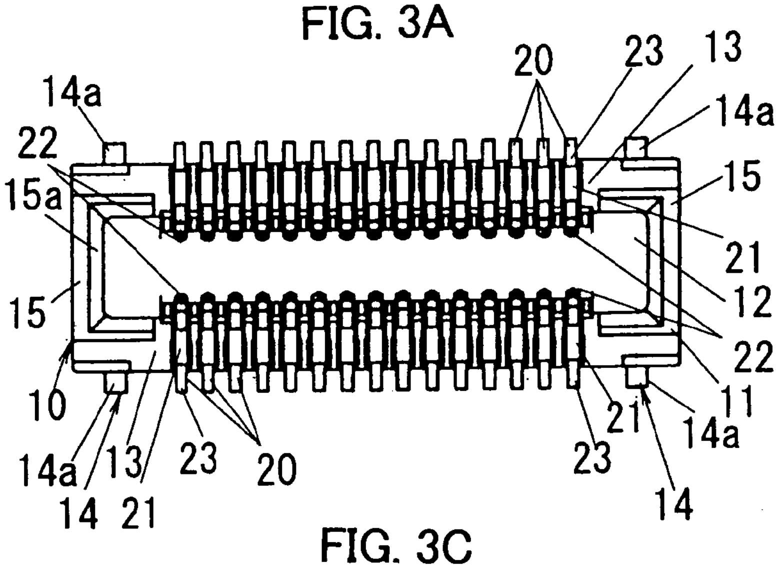
FIG. 3A is a front view showing the socket of the connector in accordance with the above embodiment.
Figure 3B:
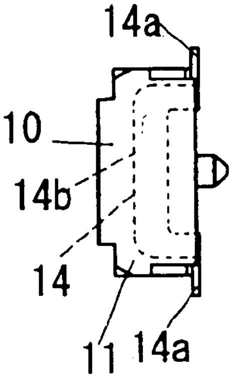
FIG. 3B is a right side view thereof and FIG. 3C is a bottom view thereof.
Figure 3C:
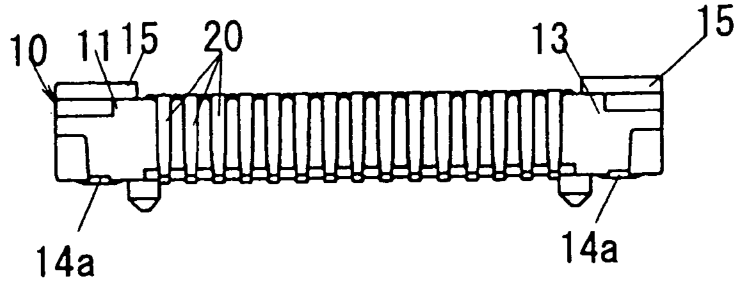

In addition, as shown in FIG. 3B, terminal reinforcing metal fittings 14 are embedded in both end portions of the socket body 11 in longitudinal direction by insert molding. The terminal reinforcing metal fitting 14 has a pair of fixed portions 14*a* respectively protruding outward from the lower ends of the side walls 13 of the socket body 11, and a coupling portion 14*b* of substantially reverse U-shape coupling between a pair of the fixed portions 14*a* and embedded in the socket body 11. The fixed portions 14*a* of the terminal reinforcing metal fitting 14 are arranged to be substantially the same height as the terminal portions 23 of the socket contacts 20. When the terminal portions 23 of the socket contacts 20 are soldered on a conductive pattern of a circuit board, the fixed portions 14*a* of the terminal reinforcing metal fitting 14 are soldered on lands of the circuit board simultaneously. Thereby, fixing strength of the socket body 11 to the circuit board can be reinforced. Furthermore, the stress applied to the socket contact 20 when the socket 10 and the header 30 are connected can be reduced by the fixed portions 14*a* of the terminal reinforcing metal fittings 14.

As shown in FIG. 1 and FIGS. 5A to 5C, the header 30 has a header body 31 formed in an elongated substantially rectangular parallelepiped shape by resin molding, and a plurality of header posts 40 arranged in two lines along both side walls 33 of the header body 31 in the longitudinal direction. In the longitudinal direction of the header 30, each cross wall 35 is formed between two adjoining header posts 40 so as to join with both side walls 33. As shown in FIG. 6, in widthwise direction of the header 30, a pair of header posts 40 are disposed for facing each other in a space enclosed by two cross walls 35, and a concave portion 32 is formed between a pair of the header posts 40, in other words, in a center portion of a first face of the socket body 11 in a side to be engaged with the plug groove 12 in the widthwise direction. Furthermore, in the vicinity of the lower ends of each side wall 33 (end portion in a second face side to be mounted on a circuit board), a flange portion 34 is formed along the longitudinal direction to protrude outward in a direction substantially perpendicular to the side wall 33.

As shown in FIG. 2 and FIG. 6, each header post 40 is formed by bending a band metal into a predetermined shape by press working. Each header post 40 is unified with the header body 31 by insert molding when the header body 31 is molded by resin. The header post 40 is formed to follow along outer wall of the side wall 33 of the header body 31, and has a second contact portion 41 to be contacted with the contact salient 24 of the socket contact 20, a terminal portion 42 formed to protrude outward in a direction substantially perpendicular to the side wall 33 from the flange portion 34 and to be soldered on a conductive pattern of a circuit board, and a curved portion 43 formed in a substantially reverse U-shape striding across the side wall 33 from the vicinity of a peak of the side wall 33 and reaching to the vicinity of a bottom of the concave portion 32. A curvature radius of outer surface side of the curved portion 43 is established to be the smallest curvature radius so that the flexure portion (first contact portion) 22 of the contact 20 is rarely buckled due to scratching with the curved portion 43.

Similar to the above-mentioned socket contact 20, since the pitch between each header post 40 is very narrow as 0.4 mm extent, it is nonsense to form the header post 40 and to insert them into a die for resin molding the header body 31 one by one. Therefore, slit processing is given to a side of a plate base metal so as to form a comb-shaped portion, and press working is further given to the comb-shaped portion to be a predetermined shape. Then, the header posts 40 which are arranged in a line on a base of the base metal are simultaneously inserted into the die for molding the header body 31. Finally, each header post 40 is cut off from the base metal after unification of the header body 31 and the header posts 40 by insert molding.

In addition, loss pins 40*a* of the header post serving as terminal reinforcing metal fittings are integrally embedded with the header body 31 by insert molding in both end portions of the header body 31 in the longitudinal direction. The loss pins 40*a* are formed on the same base metal as the header posts 40, and has substantially the same cross-sectional shape as shown in FIG. 6. However, a portion of each loss pin 40*a* corresponding to the second contact portion 41 is embedded in the both end portions of the header body 31 so that it is not exposed. Furthermore, a fixed portion 42*a* of the loss pin 40*a* corresponding to the terminal portion 42 is cut off shorter than the terminal portion 42 of the header post 40 so as to be substantially the same as the largest dimension of the header body 31 in the widthwise direction. When the terminal portions 42 of the header posts 40 are soldered on a conductive pattern of a circuit board, the fixed portions 42*a* of the loss pins 40*a* are soldered on lands of the circuit board simultaneously. Thereby, fixing strength of the header body 31 to the circuit board can be reinforced. Furthermore, the stress applied to the header post 40 when the socket 10 and the header 30 are connected can be reduced by the fixed portions 42*a* of the loss pins 40*a*.

The socket 10 and the header 30 of the connector 1 in accordance with this embodiment configured as above are respectively mounted on two circuit boards which are to be connected electrically. Specifically, the terminal portions 23 of the socket contacts 20 of the socket are soldered on a conductive pattern of one of the circuit boards, for example, a hard circuit board, and the terminal portions 42 of the header posts 40 of the header 30 are soldered on a conductive pattern of the other circuit board, for example, an FPC. When the header 30 is engaged with the plug groove 12 of the socket 10, the socket contacts 20 of the socket 10 are electrically connected to the header posts 40 of the header 30. Simultaneously, the conductive pattern of the hard circuit board is electrically connected to the conductive pattern of the FPC via the socket contacts 20 and the header posts 40.

Hereupon, when the socket 10 and the header 30 are connected, the contact salient (free end of the first contact portion) 24 of the socket contact 20 contacts on outer surface side of the curved portion 43 of substantially reverse U-shape provided on the front end portion of the header post 40. The curvature radius of the curved portion 43 of the header post 40, however, is established to be the smallest curvature radius that at least the socket contact 20 is rarely buckled due to scratching with the curved portion 43. Thus, it is possible to reduce the dimension of the header body 31 in the widthwise direction and to downsize the connector 1 with preventing the buckling of the socket contact 20. Furthermore, the curved portion 43 of substantially reverse U-shape is inserted in the header body 31 so that it strides across the side wall 33 on each side of the concave portion 32, and an end of the curved portion 43 is hooked on the bottom face of the concave portion 32. Thus, even though the header body 31 is deformed while the socket 10 and the header 30 are connected, the header post 40 is rarely flaked due to rising up from the surface of the header body 31.

In addition, when the header 30 is engaged with the plug groove 12 of the socket 10, the slanted faces 15*a* of the guide walls 15 provided on periphery portions of the plug groove 12 serve as guide of the header 30. Therefore, even though the relative position of the header 30 with respect to the socket 10 is discrepant in some measure, the header 30 can easily be engaged with the plug groove 12.

Subsequently, a process for mounting the header 30 on a circuit board is described with reference to FIGS. 7A to 7C and FIGS. 8A to 8C. When the header 30 is mounted on the circuit board, an adsorption nozzle 100 is contacted with an adsorption face of the header 30, the header 30 is adsorbed by and held on by sucking air, and the header 30 is transferred to a mounting position by moving the adsorption nozzle 100. In FIG. 7A, a reference numeral 101 designates position and size of a suction opening of the adsorption nozzle 100. As can be seen from the drawings, an adsorption face of the adsorption nozzle 100 closely attaches on an adsorption face of the header 30, that is, a first face thereof in a side to be engaged with the plug groove 12 of the socket body 11. Furthermore, two or three concave portions 32 face one suction opening 101 of the adsorption nozzle 100. Still furthermore, each concave portion 32 is separated by the cross walls 35. Thus, an enclosed space is formed with respect to the concave portions 32 facing one suction opening 101 of the adsorption nozzle 100 by a contacting face of the adsorption nozzle 100, both side walls 33 of the header body 31, the cross walls 35 and the bottom faces of the concave portions 32. Therefore, when air in the enclosed space is sucked from the suction opening 10 (SIC: correctly 101) of the adsorption nozzle 100, negative pressure occurs in the enclosed space, so that the header 30 is adsorbed by and held on the adsorption nozzle 100.

In this case, dimensions of the concave portion 32 in the longitudinal direction and in the widthwise direction can be made smaller than a diameter of the suction opening 101 of the adsorption nozzle 100, respectively, so that a dimension of the header body 31 in the widthwise direction can be made smaller in comparison with the conventional example that the adsorption nozzle is contacted on the bottom face of the engaging groove 72 provided on the header body 71 (referring to FIGS. 14A to 14C and FIG. 15). As a result, the header 30 can be downsized with enabling the adsorption and holding of the header 30 by the adsorption nozzle 100.

In addition, since a plurality of cross walls 35 is provided between the adjoining header posts 40, even when the relative position of the suction opening 101 of the adsorption nozzle 100 for the adsorption face of the header body 31 is discrepant in some small measure, any cross walls 35 are disposed on both sides of the suction opening 101, so that leakage of air can be prevented surely. Besides, the present invention is not limited to the configuration of this embodiment, and it is sufficient that at least one cross wall 35 of the header body 31 is disposed on both side of a position facing each suction opening 101 of the adsorption nozzle 100.

Subsequently, a process for mounting the socket 10 on a circuit board is described with reference to FIG. 1, FIGS. 9A to 9C, FIG. 10, and FIGS. 11A to 11C. When the socket 10 is mounted on the circuit board, the socket 10 is not directly adsorbed by and held on the adsorption nozzle 100, but an adsorption cover 90 shown in FIG. 1 and FIGS. 9A to 9C is attached to the socket body 11, and a main portion 91 of the adsorption cover 90 is adsorbed by the adsorption nozzle 100 so as to hold the socket 10, and the socket 10 is transferred to a mounting position by moving the adsorption nozzle 100.

The adsorption cover 90 is formed in a shape which can be attached to the socket body 11 by performing punching work and bending work to a thin metal plate. The adsorption cover 90 has the main portion 91 of a substantially rectangular plate shape, two pairs of arm portions 92 protruding in longitudinal direction and in a direction perpendicular to the main portion 91 from both end portions of the main portion 91, engaging portions 93 formed in the vicinity of front ends of respective of the arm portions 92 and to be engaged with the socket body, and protruding portions 94 formed to protrude outward in longitudinal direction from center portions on both ends of the main portion 91 in the longitudinal direction and to be engaged with inner side faces of the substantially square cornered U-shaped guide walls 15 of the socket body 11.

A dimension between both protruding portions 94 in the longitudinal direction of the main portion 91 is formed substantially the same dimension as a distance between a pair of guide walls 15 provided on the socket body 11. Furthermore, a dimension of the main portion 91 in the widthwise direction is formed substantially the same as the dimension of the socket body 11 in the widthwise direction. Then, the main portion 91 is disposed on a face of the socket body 11 facing the header 30 in a state that the adsorption cover 90 is engaged with the socket body 11.

The engaging portions 93 are protruded toward the socket body 11 side from both end portions of the arm portion 92 in the longitudinal direction, and an intermediate portion of each is curved to protrude toward the side face of the socket body 11, and each has flexibility. On the other hand, engaging concavities 16, which are to be engaged with the engaging portions 93 of the adsorption cover 90, are formed in vicinities of lower ends of both end portions of the side walls 13 of the socket body 11 in the longitudinal direction. Furthermore, slanted faces 17 are formed at corners of both side walls 13 facing the header 30 in a manner so that the width dimension of the socket body 11 becomes narrower at a portion approaching to upward.

In order to attach the adsorption cover 90 on the socket 10, positions of the engaging portions 93 are fit to those of the slanted faces 17, and the adsorption cover 90 is approached to the socket body 11. When each engaging portion 93 contacts with the slanted face 17, the engaging portion 93 slides on the slanted face 17 so that the engaging portion 93 is bent outward. Furthermore, when the engaging portion 93 climbs over the slanted face 17, the engaging portion 93 is restored to original shape by elasticity, so that it is engaged with the engaging concavity 16. Consequently, as shown in FIG. 10 and FIGS. 11A to 11C, the adsorption cover 90 is attached to the socket 10. At this time, the protruding portions 94 protruding from the main portion 91 are engaged with the inner side faces of the guide walls 15 of square cornered substantially U-shape, so that displacement of the adsorption cover 90 in a plane parallel to the main portion 91 can be reduced.

Under a state that the adsorption cover 90 is attached to the socket 10, the adsorption nozzle 100 is contacted with the main portion 91 of the adsorption cover 90, and air sucked from the suction opening 101, so that the adsorption cover 90 is adsorbed by and held on the adsorption nozzle 100. Then, the socket 10 is transferred to a mounting position by moving the adsorption nozzle 100. In this way, since the adsorption cover 90 attached to the socket 10 is adsorbed by and held on the adsorption nozzle 100, the width dimension of the plug groove 12 in the widthwise direction can be made smaller in comparison with the conventional example that the front end face 53*a* of the protruding table 53 protruded in the plug groove 52 of the socket body 51 is used as the adsorption face (referring to FIGS. 12A to 12C and FIG. 13). As a result, the dimension of the socket 10 in the widthwise direction can be made smaller.

Besides, a distance between a pair of engaging portions 93 in the widthwise direction of the socket body 11 is established to be substantially the same dimension as a distance between the engaging concavities 16 provided on both side walls 13 in the widthwise direction. In a state that the adsorption cover 90 is attached to the socket 10, that is, in the state that the engaging portions 93 are engaged with the engaging concavities 16, the engaging portions 93 are not bent outward, so that they are restored to the original shapes. Therefore, supposedly in comparison with a case that the engaging portions 93 are engaged with the engaging concavities 16 while they are elastically deformed, even when the socket body 11 which is a molded product is expanded by heat, for example, in reflow of solder under the state that the engaging portions 93 are engaged with the engaging concavities 16, stress applied to the engaging portions 93 or the socket body 11 becomes smaller. As a result, it is possible to prevent occurrence of crack in the socket body 11.

In addition, since the engaging concavities 16 are provided in the vicinities of both end portions of the socket body 11 in the longitudinal direction so that they are displaced from the fixed portions 14*a* of the terminal reinforcing metal fittings 14, it is possible to lay off the engaging portions 93 which are to be engaged with the engaging concavities 16 from the fixed portions 14*a*. Thus, it is possible to prevent that the solder filled on the fixed portion 14*a* is adhered on the engaging portion 93 during the reflow of the solder so that the adsorption cover 90 cannot be removed. Furthermore, since the adsorption cover 90 is attached to the socket body 11 until at least the socket 10 is mounted on a circuit board, it is possible to reduce the possibility of entrance of dust into the plug groove 12 while the conveyance or mounting of the socket 10. As a result, it is possible to prevent the reduction of reliability of electric connection due to adhesion of dust on the socket contact 20. By the way, when the adsorption cover 90 is pulled in a direction departing from the socket 10, the engaging portions 93 are bent outward, so that the engagement between the engaging portions 93 are the engaging concavities 16 is released, and the adsorption cover 90 can easily be taken off from the socket 10. As mentioned above, in the state that the adsorption cover 90 is attached to the socket 10, the engaging portions 93 are not deformed elastically and they are restored to the original shapes, so that a force necessary for pulling out the adsorption cover 90 becomes smaller. Thus, stress applied to the terminal portion 23 of the socket contact 20 which is soldered on the circuit board can be made smaller.

The adsorption cover 90 is formed by performing the bending work after punching the metal plate with using a punching die, and the shape thereof is shaped symmetrical with respect to a center line in the longitudinal direction. Therefore, it is possible to manufacture the adsorption covers 90 corresponding to the sockets 10 of various lengths which are different the number of arrangement of the socket contacts 20 by preparing a punching die for punching to a shape of an end portion in the longitudinal direction, that is, a pair of the arm portions 92, the engaging portions 93 and the protruding portions 94 in one side, and a punching die for punching the intermediate portion in the longitudinal direction. Specifically, if the adsorption cover 90 were formed of resin molding, it were necessary to prepare independent molding dies corresponding to the number of arrangement of the socket contacts 20, that is, the dimension of the socket contact 10 in the longitudinal direction. While on the other hand, when the adsorption cover 90 is formed by performing the bending work after punching the metal plate with using the punching dies, the intermediate portion of the adsorption cover 90 in the longitudinal direction is simply punched out to be rectangular shape, so that it is easily compatible to the difference of the number of arrangement of the socket contacts 20 by changing the length to be punched out by the punching die for the intermediated portion. Therefore, production cost of the dies can be reduced.

Figure 5A:
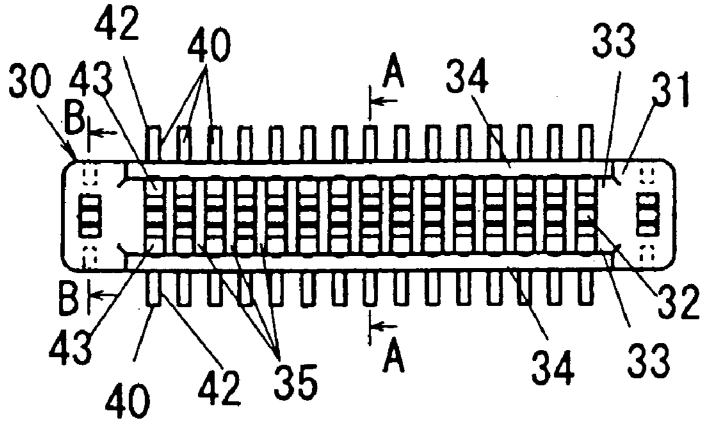
FIG. 5A is a front view showing the header of the connector in accordance with the above embodiment.
Figure 5B:
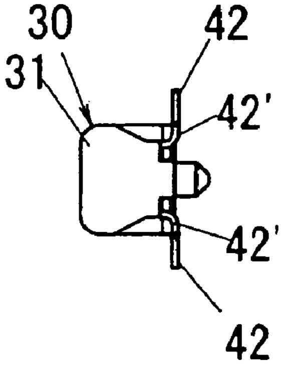
FIG. 5B is a right side view thereof and FIG. 5C is a bottom view thereof.
Figure 5C:
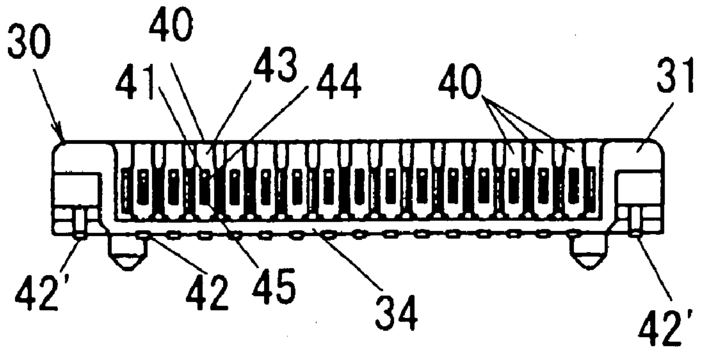
Figure 6A:
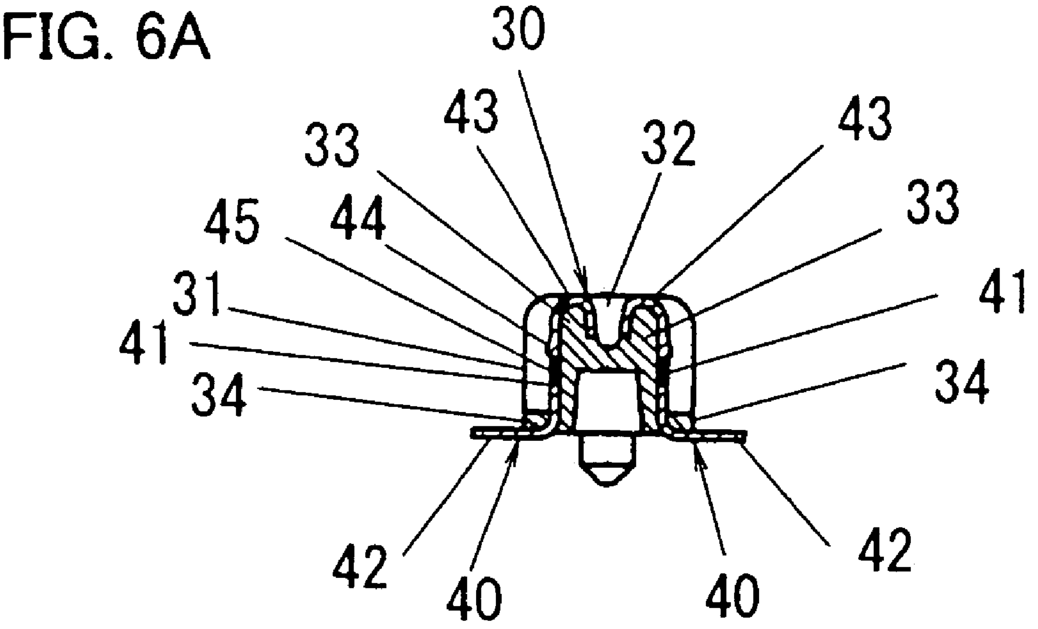
FIG. 6A is A—A sectional view in FIG. 5A.
Figure 6B:
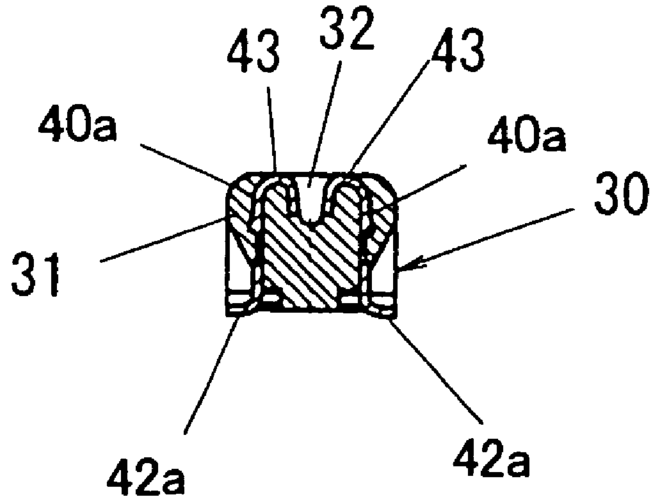
FIG. 6B is B—B sectional view in FIG. 5A.
Figure 6C:
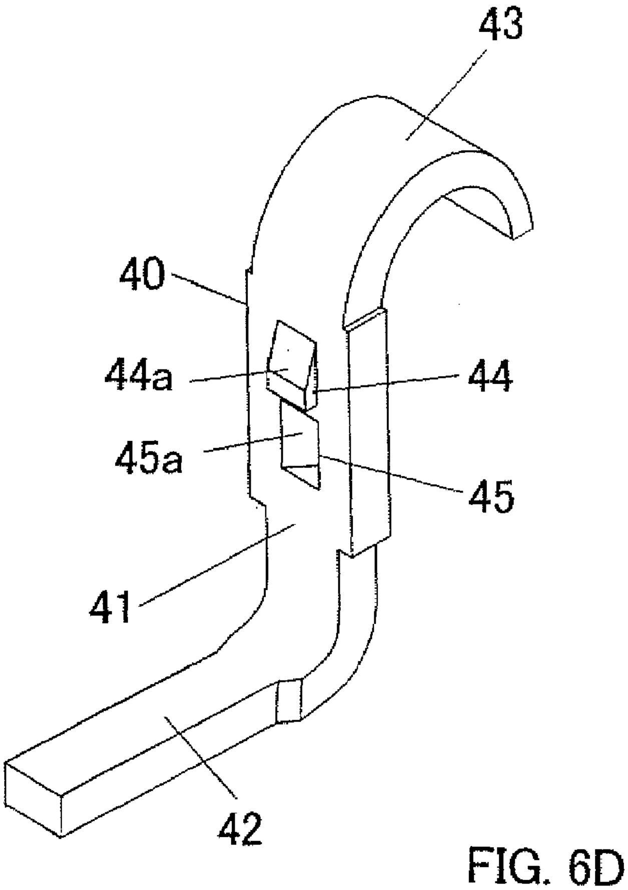
Figure 6D:
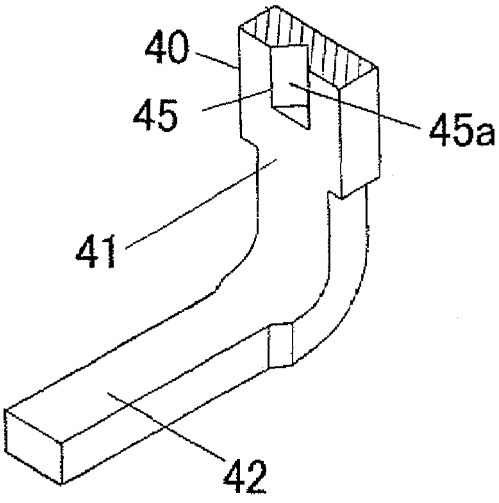
Figure 8A:
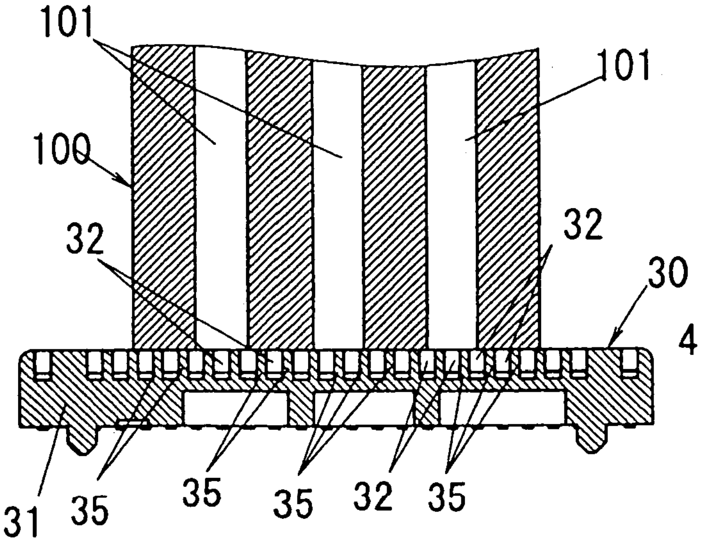
FIG. 8A is a sectional view of FIG. 7B.
Figure 8B:
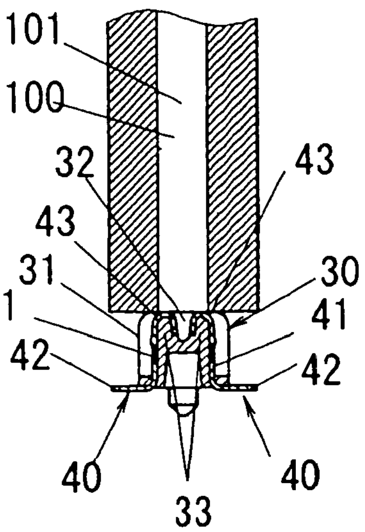
FIG. 8B is a sectional view of FIG. 7C.
Figure 9B:
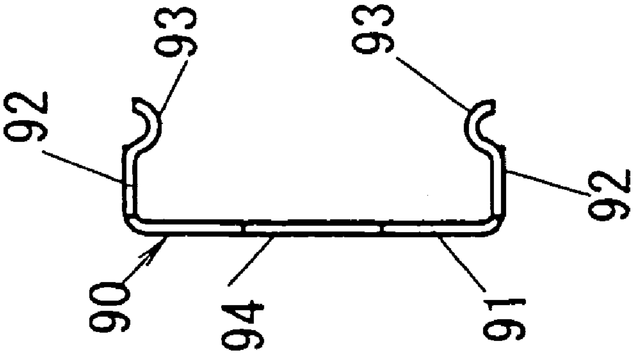
FIG. 9B is a bottom view thereof.
Figure 9A:
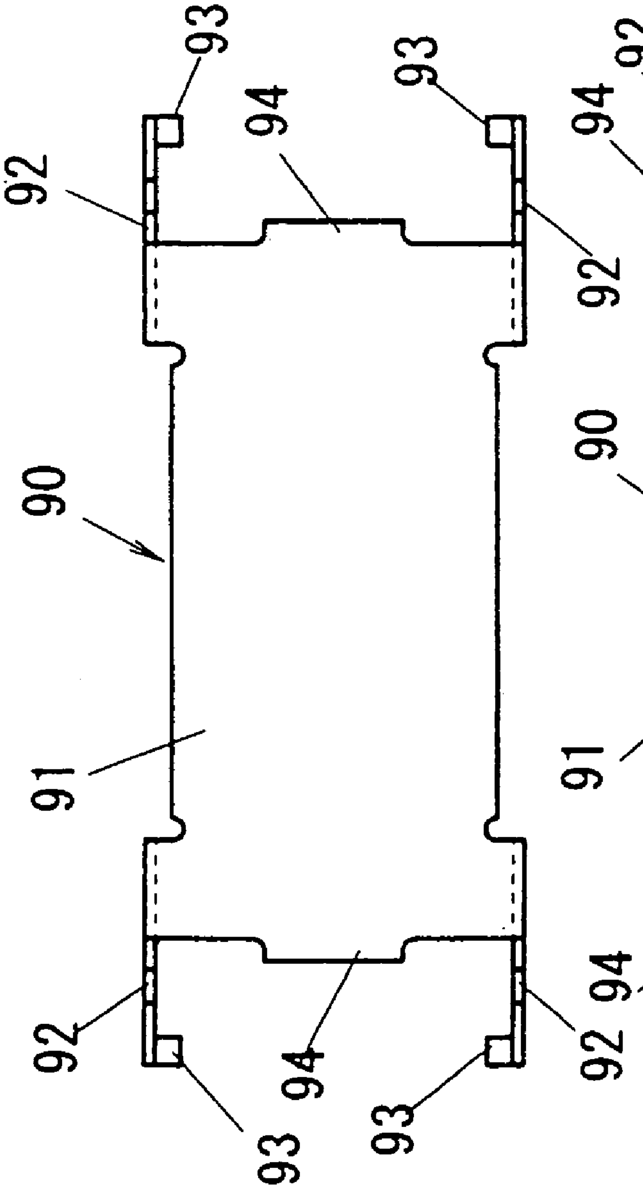
FIG. 9A is a front view showing a configuration of an adsorption cover which is attached to the socket of the connector in accordance with the above embodiment.
Figure 9C:
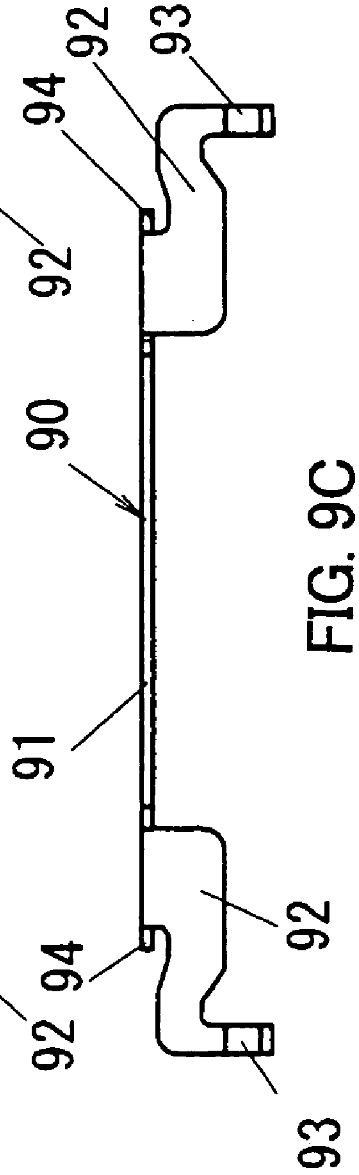
FIG. 9C is a right side view thereof.
Figure 10:
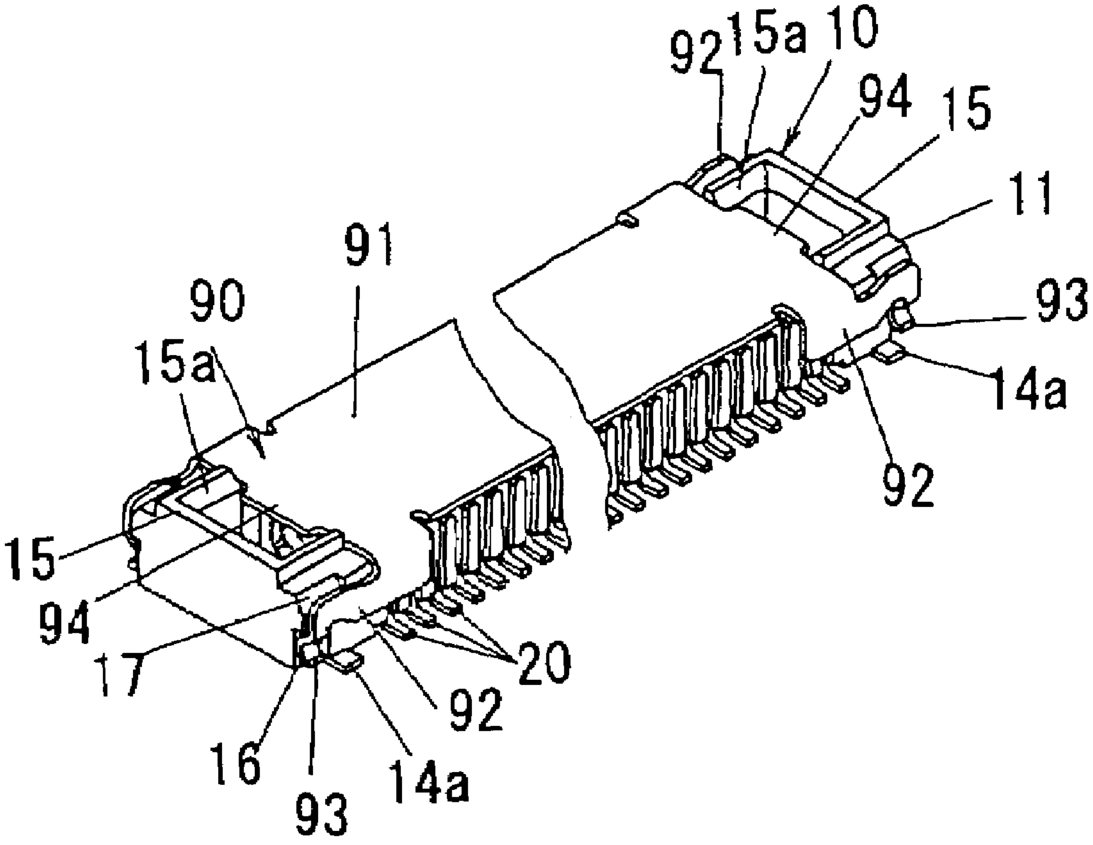
FIG. 10 is a perspective view showing a state that the adsorption cover is attached to the socket of the connector in accordance with the above embodiment.
Figure 12A:
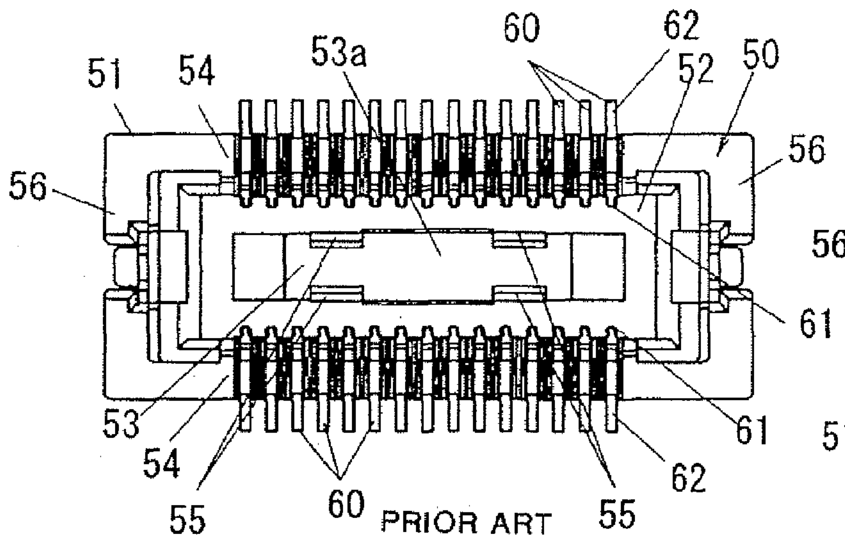
FIG. 12A is a front view showing a socket of a conventional connector.
Figure 12B:
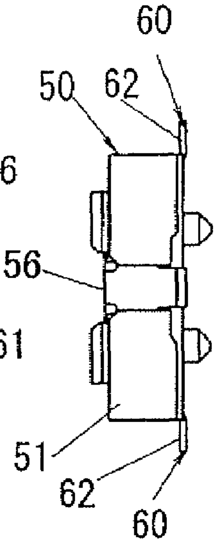
PRIOR ART FIG. 12B
FIG. 12B is a right side view thereof and FIG. 12C is a bottom view thereof.
Figure 12C:
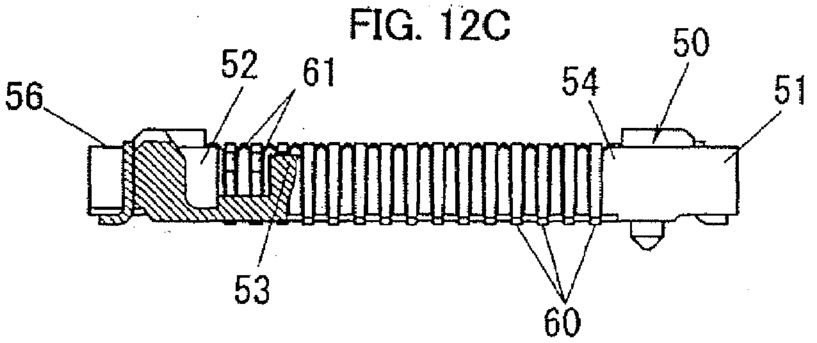
Figure 13:
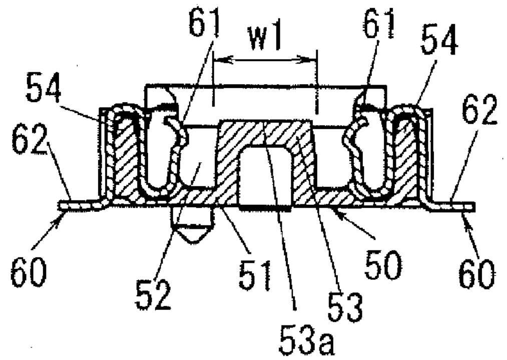
PRIOR ART FIG. 13
FIG. 13 is a side sectional view of the socket of the above conventional connector.

Furthermore, as shown in FIG. 1, FIG. 2, FIG. 5C and FIG. 6A, a protrusion 44 and a concavity 45 are provided at positions of the second contact portion 41 of the header post 40 where the contact salient 24 of the socket contact 20 slides. Specifically, as shown in FIG. 1 and FIG. 5C, the protrusion 44 is formed at a position a little upper (opposite side to the protrusion of the terminal portion 42) than the center of the header post 40 in heightwise direction. A slanted face 44*a* is formed on an outer face of the protrusion 44 so that a dimension of protrusion at a portion nearer to the terminal portion 42 becomes larger. The concavity 45 is a channel shape elongating along the heightwise direction of the header post 40, and has two slanted faces 45*a* depth of which becomes deeper for approaching to the center in the widthwise direction so that the section in the widthwise direction of the header post 40, that is, the direction crossing at right angle with the above heightwise direction becomes substantially V-shape. A width dimension of the concavity 45 in the widthwise direction of the header post 40 is formed to be wider than a width dimension of the protrusion 44, and smaller than a width dimension of the contact salient 24. In addition, the dimensions and position of the concavity 45 in the heightwise direction of the header post 40 are established in a scope that the contact salient 24 of the socket contact 20 slides on the second contact portion 41.

According to such configuration, under a state that the header 30 is fully inserted into the plug groove 12 of the socket 10 shown in FIG. 2, the contact salient 24 contacts both side portion of the concavity 45, and the protrusion 44 is positioned in the bottom face side of the plug groove 12 from the contact salient 24. Furthermore, in a process for inserting the header 30 into the plug groove 12 of the socket 10, the contact salient 24 elastically contacts both sides of the concavity 45 in the second contact portion 41 of the header post 40. Still furthermore, an area among the contact salient 24 which contacts the protrusion 44 is not overlapped to an area contacting the both sides of the concavity 45. Thus, even though extraneous substance is adhered on the contact salient 24 of the socket contact 20 or the second contact portion 41 of the header post 40 before the socket 10 and the header 30 are connected, the extraneous substance can be dropped into the concavity 45 in the process that the contact salient 24 slides on the surface of the second contact portion 41. Accordingly, in comparison with the case that no concavity 45 is provided on the second contact portion 41 of the header post 40, the possibility that the extraneous substance is wedged between the contact salient 24 and the second contact portion 41 becomes lower. In other words, by providing the protrusion 44 and the concavity 45 on the second contact portion 41 of the header post 40, poor contacting between the socket contact 20 and the header post 40 due to extraneous substance can be prevented. Furthermore, the contact salient 24 contacts at two points on both sides of the concavity 45, so that contact reliability of the socket contact 20 and the header post 40 can be increased. Still furthermore, the concavity 45 is provided on the second contact portion 41 of the header post 40 in the scope of sliding of the contact salient 24, so that the extraneous substance adhered on the contact salient 24 can be dropped in the concavity 45 surely, in comparison with the case that the concavity 45 is provided at a portion out of the scope of sliding of the contact salient 24.

Furthermore, when force is applied to the header 30 in a direction pulled out from the plug groove 12 of the socket 10, the contact salient 24 of the socket contact 20 contacts the protrusion 44 of the header post 40, so that it receives resistance force from the protrusion 44. Therefore, there is an advantageous merit that the header 30 is hardly pulled out from the plug groove 12 of the socket 10. By the way, when the header 30 is inserted into the plug groove 12 of the socket 10, the contact salient 24 of the socket contact 20 contacts the protrusion 44 of the header post 40. However, since the slanted face 44*a* is formed on the protrusion 44 in a manner so that the protruding dimension becomes larger at a position nearer to the terminal portion 42, the resistance when the header 30 is inserted into the plug groove 12 becomes smaller than the resistance when the header 30 is pulled out from the plug groove 12. Furthermore, since the position and shape of the concavity 45 is established in a manner so that the scope contacting with the protrusion 44 is not overlapped with the scope contacting with both sides of the concavity 45 on the contact salient 24, the extraneous substance pushed by the contact salient 24 is dropped into the concavity 45 while the contact salient 24 slides on the surface of the protrusion 44 and rarely wedged between the contact salient 24 and the second contact portion 41.

In this embodiment, the contact salient 24 of the socket contact 20 is elastically contacted with both sides of the concavity 45 on the second contact portion 41 of the header post 40, and the extraneous substance is dropped into the concavity 45 in the process that the contact salient 24 slides on the surface of the second contact portion 41, so that the possibility that the extraneous substance is wedged between the contact salient 24 and the second contact portion 41 is reduced, and the contact reliability is increased. The shapes and the contact condition of the contact salient 24 of the socket contact 20 and the second contact portion 41 of the header post 40, however, are not limited to the description of the above-mentioned embodiment. For example, it is possible that the face of the contact salient 24 of the socket contact 20 which contacts with the second contact portion 41 of the header post 40 is formed in a shape (for example, curved surface shape) that a center portion in the widthwise direction thereof is protruded toward the second contact portion 41 of the header post 40 than both side portion. In such case, the center portion of the contact salient 24 of the socket contact 20 in the widthwise direction proceeds into the concavity 45, and contacts at two points with two slanted faces in the concavity 45 or edges of the opening of the concavity 45. Although the shape of the socket contact 20 becomes complex in comparison with the case that the contact salient 24 of the socket contact 20 and the second contact portion 41 of the header post 40 are contacted with each other on flat surfaces, the contacting area of the contact salient 24 and the second contact portion 41 becomes smaller so that the contact pressure increases. As a result, the extraneous substance can easily be discharged between the contact salient 24 and the second contact portion 41, so that the contact reliability of the socket contact 20 and the header post 40 is increased.

Furthermore, it is sufficient that the curvature radius of the curved portion 43 of the header post 40 in at least the side of the second contact portion 41 from the peak of the curved portion 43 is established to be the smallest in the scope that the contact salient (free end) 24 of the flexure portion (first contact portion) 22 of substantially U-shape of the socket contact 20 contacts with the side of the second contact portion 41 from the peak of the curved portion 43 of the header post 40, and the socket contact 20 is not buckled due to scratching with the curved portion 43, while the header 30 is engaged with the plug groove 12 of the socket body 11. For example, by establishing the curvature radius of a portion of the curved portion 43 of the header post 40 opposite to the second contact portion 41 from the peak of the curved portion 43 smaller than the curvature radius of a portion in the side of the second contact portion 41 from the peak of the curved portion 43, the width dimension of the header 30, in other words, the width dimension of the connector 1 can be made much smaller.

Furthermore, it is sufficient that the header body 31 has a concave portion 32 on the first face of the socket body 11 which is the side to be engaged with the plug groove 12, the concave portion 32 is separated by at least two cross walls 35, and an enclosed space is formed by at least two cross walls 35, a bottom face of the concave portion 32 and the adsorption face of the adsorption nozzle 100 in a state that the adsorption face of the adsorption nozzle 100 is contacted with the first face so that the suction opening 101 of the adsorption nozzle 100 faces the concave portion 32, thereby, the header 30 is adsorbed by and held on the adsorption nozzle 100.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

The invention claimed:

1. An electrical connector comprising:

a header having a header body formed of an insulation material, and a plurality of header posts held on a side wall of the header body; and a socket having a socket body formed of an insulation material and having a plug groove configured to engage the header, and a plurality of socket contacts held on a side wall of the plug groove, wherein the socket contacts are configured to contact the header posts when the header engages the plug groove, wherein:

the header body has a plurality of concave portions provided on a first face which faces a bottom face of the plug groove, wherein the first face is configured to engage the plug groove, and wherein at least one of the socket contacts has a first contact portion;

at least one of the header posts has a second contact portion, disposed along a side wall of the header body, and configured to contact the first contact portion of the at least one socket contact, a curved portion formed in a substantially reverse U-shape extending from an end of the first face of the header body, which is proximate the side wall, towards the concave portion, and a terminal portion formed to protrude outward from a side of the second contact portion opposite to the curved portion such that the terminal portion is substantially perpendicular to the side wall; and the concave portions are separated by at least two cross walls which separate respective gaps provided between the header posts such that an enclosed space is formed by the at least two cross walls, a bottom face of the concave portion and an adsorption face of an adsorption nozzle when the adsorption face of the adsorption nozzle contacts the first face such that a suction opening of the adsorption nozzle faces the concave portion.

2. The electrical connector in accordance with claim 1, wherein the plug groove of the socket body has a substantially rectangular shape and the header is configured to engage a center portion thereof, and wherein the plug groove has two side walls, and the socket body has engaging concavities formed in vicinities of end portions of the two side walls, and when the socket body is mounted on a circuit board, an adsorption cover is attached to the socket body via engaging portions of the adsorption cover covering at least a part of the plug groove and engaging the engaging concavities of the socket body, and wherein a portion of the adsorption cover covering a part of the engaging groove is adsorbed and held by the adsorption nozzle.

3. The electrical connector in accordance with claim 2, wherein the socket body has inserted or press-fitted reinforcing members provided proximate the end portions of the two side walls; and the engaging concavities are formed at positions distant from fixed portions of the reinforcing member.

4. The electrical connector in accordance with claim 3, wherein the concavity has a channel shape and is elongated along the heightwise direction of the at least one header post.

5. The electrical connector in accordance with claim 4, wherein the concavity has two slanted faces having a depth which becomes deeper as the slanted faces approach a center of the at least one header post in a widthwise direction thereof, such that a section in the widthwise direction of the at least one header post has a substantially V-shape.

6. The electrical connector in accordance with claim 1, wherein a protrusion and a concavity are serially provided on the second contact portion of the at least one header post and extend along a heightwise direction of the header toward a second face opposite to the first face.

7. The electrical connector in accordance with claim 6, wherein the protrusion is formed in the heightwise direction of the at least one header post at a position nearer to the first face than the second face.

8. The electrical connector in accordance with claim 6, wherein a slanted face is formed on an outer face of the protrusion such that a dimension of the protrusion becomes larger in a direction extending from the first face toward the second face.

9. The electrical connector in accordance with claim 6, wherein a width dimension of the concavity in the widthwise direction of the at least one header post is formed to be larger than a width dimension of the protrusion and smaller than a width direction of the first contact portion of the at least one socket contact.

10. The electrical connector in accordance with claim 6, wherein dimensions and position of the concavity in the heightwise direction of the at least one header post is configured to allow the first contact portion of the at least one socket contact to slide on the second contact portion.

* * * * *